United States Patent [19]

Trotel

[11] 4,110,622

[45] Aug. 29, 1978

[54] DEVICE WHICH MAKES IT POSSIBLE TO EFFECT THE PROGRAMMED TRACING OF FIGURES WHICH HAVE DIFFERENT SHAPES

[75] Inventor: Jacques Trotel, Paris, France

[73] Assignee: Thomson-CSF, Paris, France

[21] Appl. No.: 796,708

[22] Filed: May 13, 1977

[30] Foreign Application Priority Data

May 14, 1976 [FR] France .............................. 76 14719
Jan. 31, 1977 [FR] France .............................. 77 02600

[51] Int. Cl.² .............................................. G21K 1/08
[52] U.S. Cl. ......................... 250/396 R; 250/396 ML
[58] Field of Search ..................... 250/396 R, 396 ML

[56] References Cited

U.S. PATENT DOCUMENTS

| 2,356,535 | 8/1944 | Ruska ............................... 250/396 R |
| 3,629,575 | 12/1971 | Rakels ............................... 250/396 |
| 3,857,034 | 12/1974 | Hoppe ............................... 250/396 R |
| 3,996,468 | 12/1976 | Fletcher ............................ 250/396 R |

Primary Examiner—Harold A. Dixon
Attorney, Agent, or Firm—Cushman, Darby & Cushman

[57] ABSTRACT

A device to effect the programmed tracing of figures which have different shapes comprises two electron-optical systems respectively associated with two diaphragms. The first system forms the image of the first diaphragm at a fixed magnification, on the second diaphragm. The first electrically controlled deflection system makes it possible to displace said image in said plane. A second system forms an image of the thus defined diaphragm, in the object plane. A second deflection system makes it possible to displace said latter image in the object plane.

13 Claims, 16 Drawing Figures

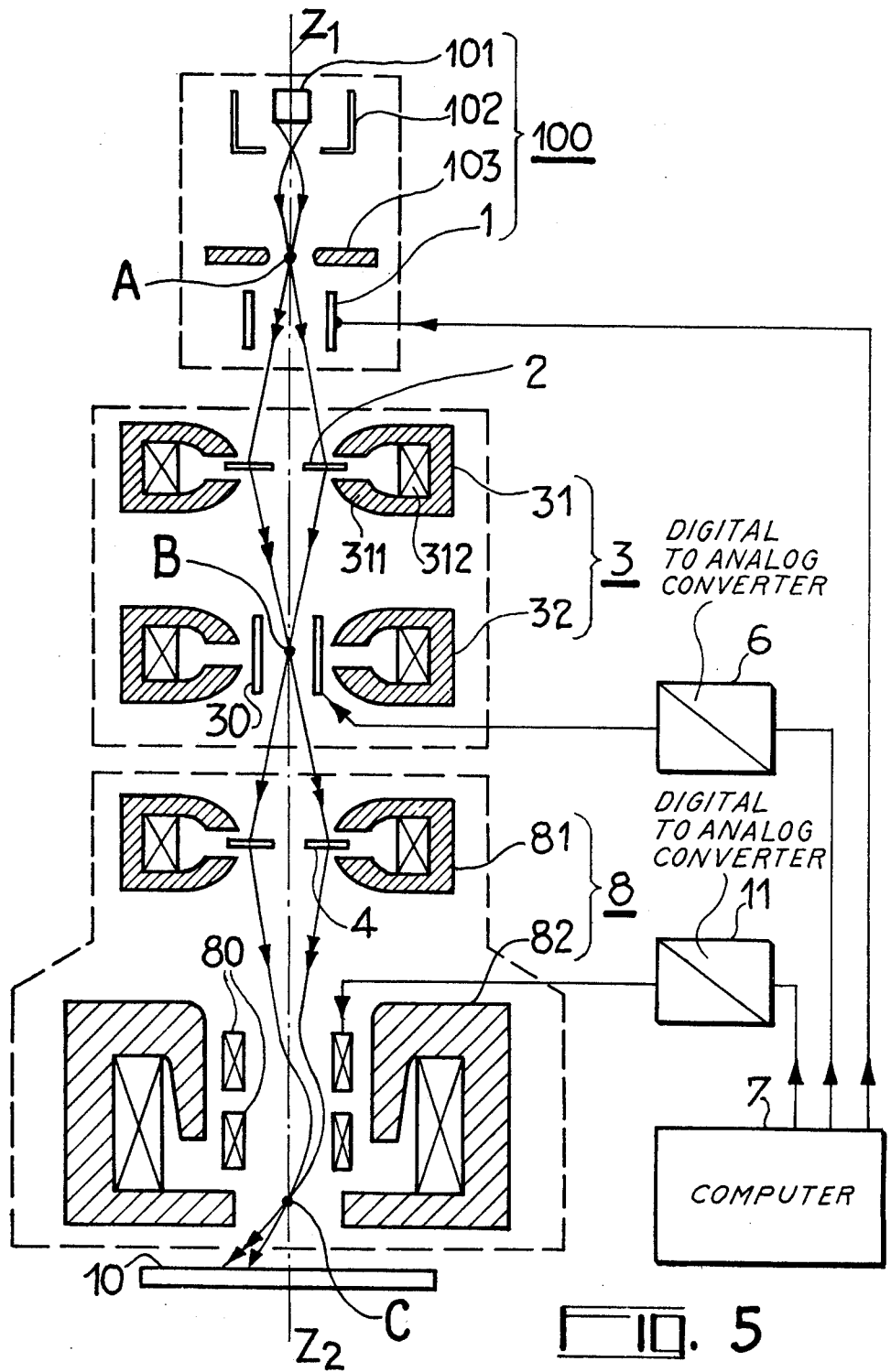

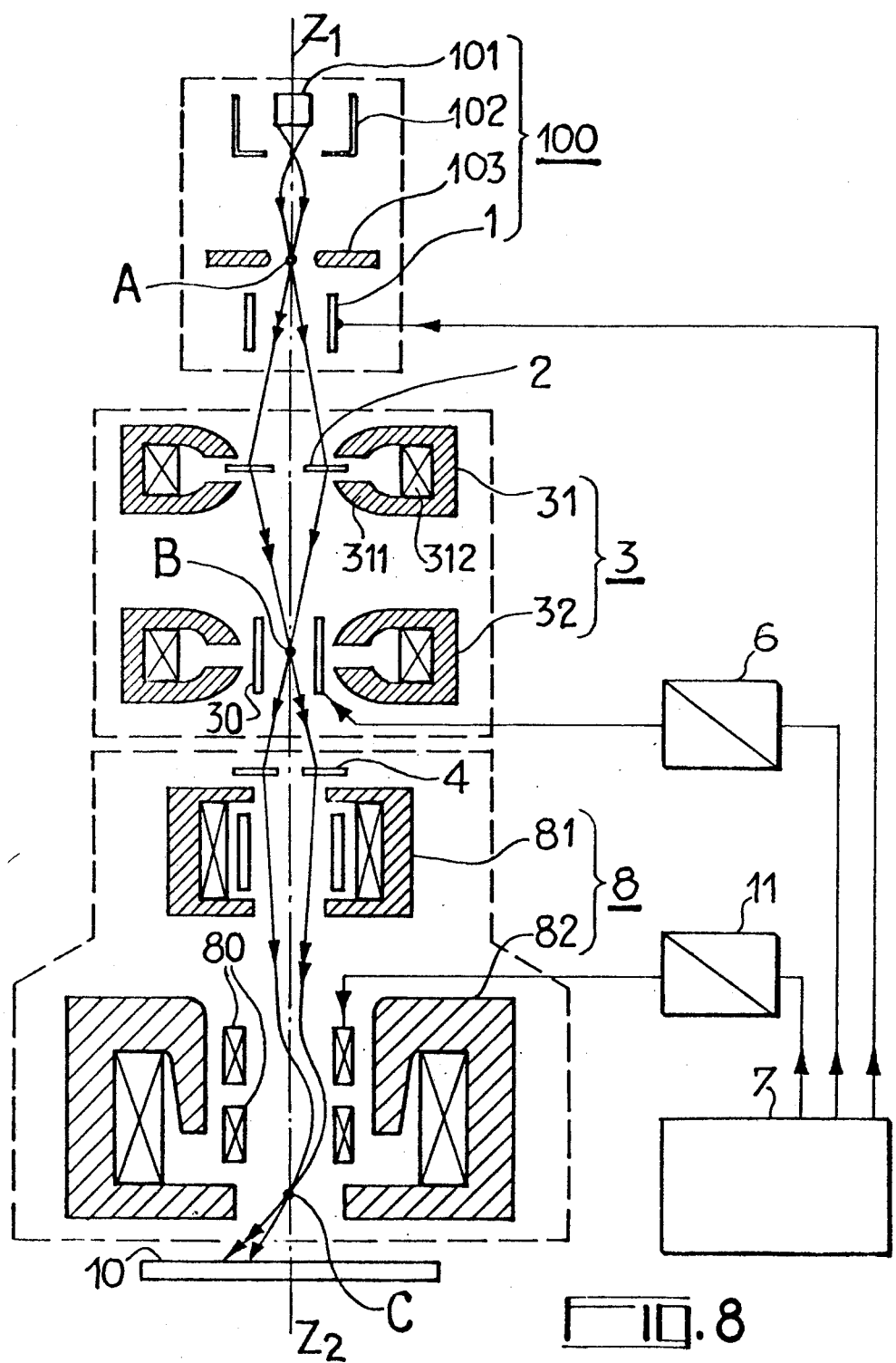

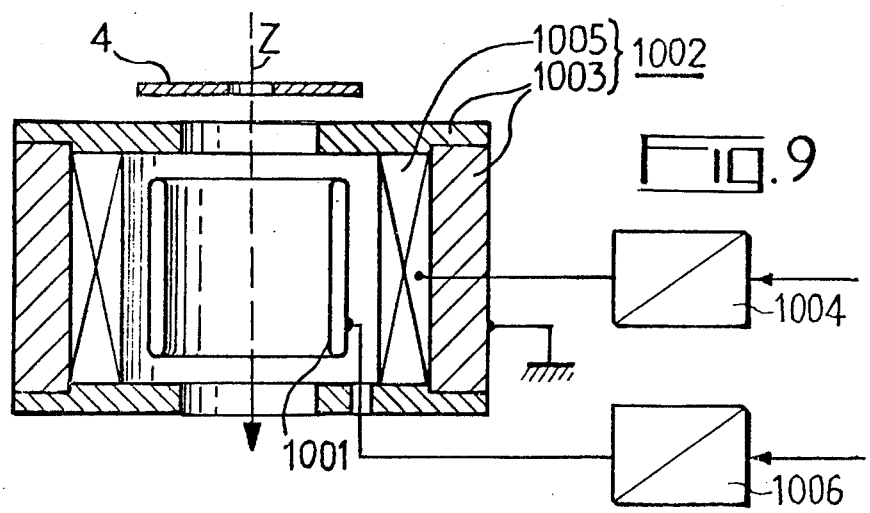
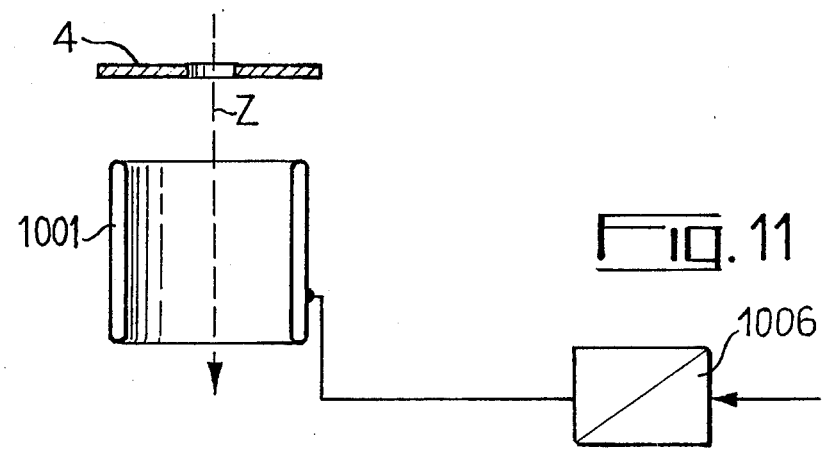
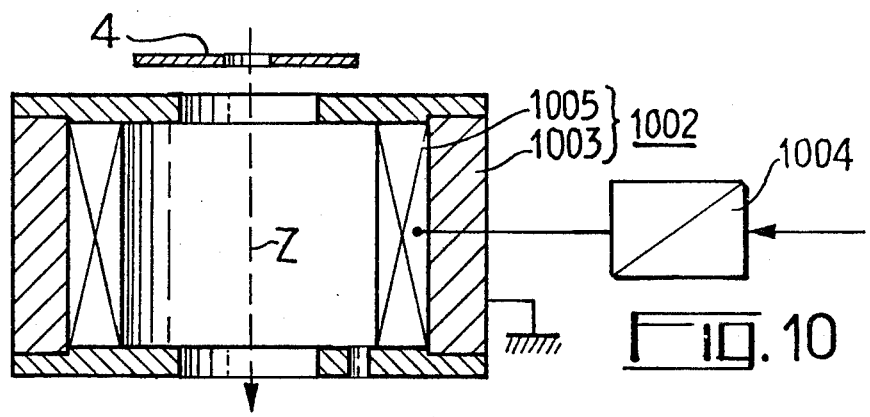

DEVICE WHICH MAKES IT POSSIBLE TO EFFECT THE PROGRAMMED TRACING OF FIGURES WHICH HAVE DIFFERENT SHAPES

The present invention relates to a particle optical device which makes it possible to effect the programmed tracing of geometric figures having different shapes.

Devices of this kind are known, in particular ones comprising conventional or electronic optical devices, which are capable under the effect of electrical signals generated by digital-analogue converters themselves connected to the output of a computer, of tracing programmed figures upon a substrate sensitive to the impact of the radiation emitted by an appropriate source.

The known devices operate by the successive projection of a series of elementary images, these images having constant shape and dimensions, permanently determined for each device. These dimensions are of the order of one micron for example. The result is that these devices are necessarily slow.

The object of the present invention is a device of this kind which, however, is much faster in operation.

The device in accordance with the invention is of the kind in which a particle optical system projects on to an object an image formed by the successive and programmed tracing of elementary images.

The device comprises a first object plane in which a first diaphragm is formed, this diaphragm allowing part of the beam to pass, first means capable of forming in a second plane a first image of this contour thus formed with a constant and predetermined magnification, second electrically controlled deflecting means in order to displace said image in said plane, a second contour element being traced in the latter and the combination of said first image and said second element forming a diaphragm in order to limit the particle beam; third means capable of forming an image of said diaphragm in a third plane containing the object on which the image is to be formed and fourth electrically controlled deflection means in order to displace said image of said diaphragm in said third plane.

The invention will be better understood from a consideration of the ensuing description and by reference to the attached drawings in which.

FIG. 5 schematically and in section illustrates an embodiment of the device in accordance with the invention;

FIGS. 6A and 6B and 7A and 7B illustrate examples of the two diaphragms;

FIG. 8 illustrates another embodiment of the invention;

FIG. 9 is a detailed view of FIG. 8;

FIGS. 10 to 13 are explanatory diagrams.

Figure 1:
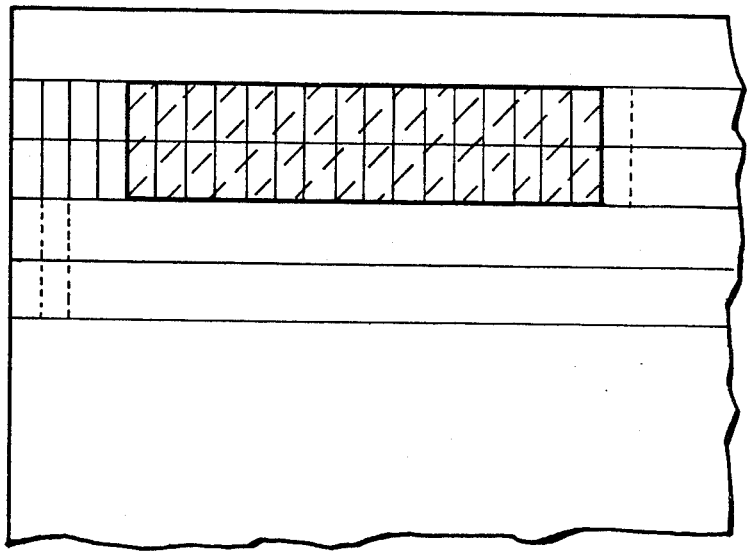
FIGS. 1 and 2 are explanatory diagrams.

In FIG. 1, it can be seen how in accordance with the prior art a design is formed by splitting it up into elementary figures. An electron-optical system produces a succession of contiguous images of a diaphragm which has not been shown, the assembly forming a rectangle one of whose sides corresponds to the dimension of the longer side of the image of the diaphragm, the other side having a dimension which is a whole number multiple of the shorter side. This assembly represents a line and is formed by the application of a slope voltage to the deflection system. This represents the scan function in the X direction. The scan function in the Y direction, OY being perpendicular to OX, is effected for example by the mechanical displacement of the object-holder.

However, those skilled in the art will be aware that the time $t$ required to form an image on a resin sensitive to electron bombardment, does not depend by first approximation upon the dimension of the area of the image contained in the solid angle formed by the beam. In other words, we can write $$t = \sigma/B\Omega$$

in which expression $\sigma$ is the resin sensitivity, $B$ the brightness of the electron source and $\Omega$ the solid apertural angle of the electron-optical system.

To produce a design of given area, it is therefore desirable to project an image of the largest possible area, bearing in mind the focussing of the beam.

In the case offered by way of example, the time to scan a line would be $T = nt$, where $n$ is the number of rectangles per line.

Figure 2:
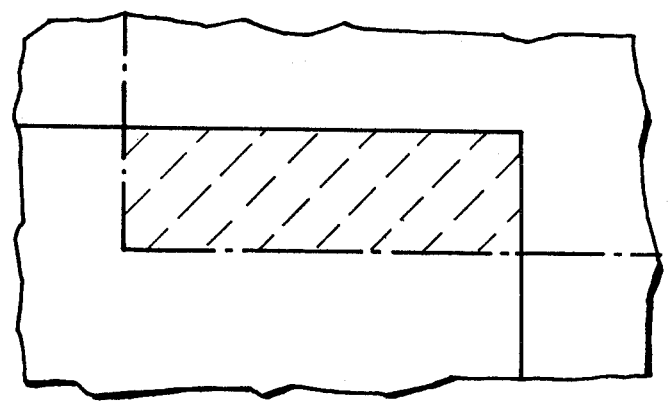

If, instead of scanning the rectangular line elementary rectangle by elementary rectangle, the line were to be subjected to a single electron bombardment, the scanning time would be divided by $n$. This is what is shown in FIG. 2

This is what the device in accordance with the invention makes it possible to do in other operations.

Figure 3:
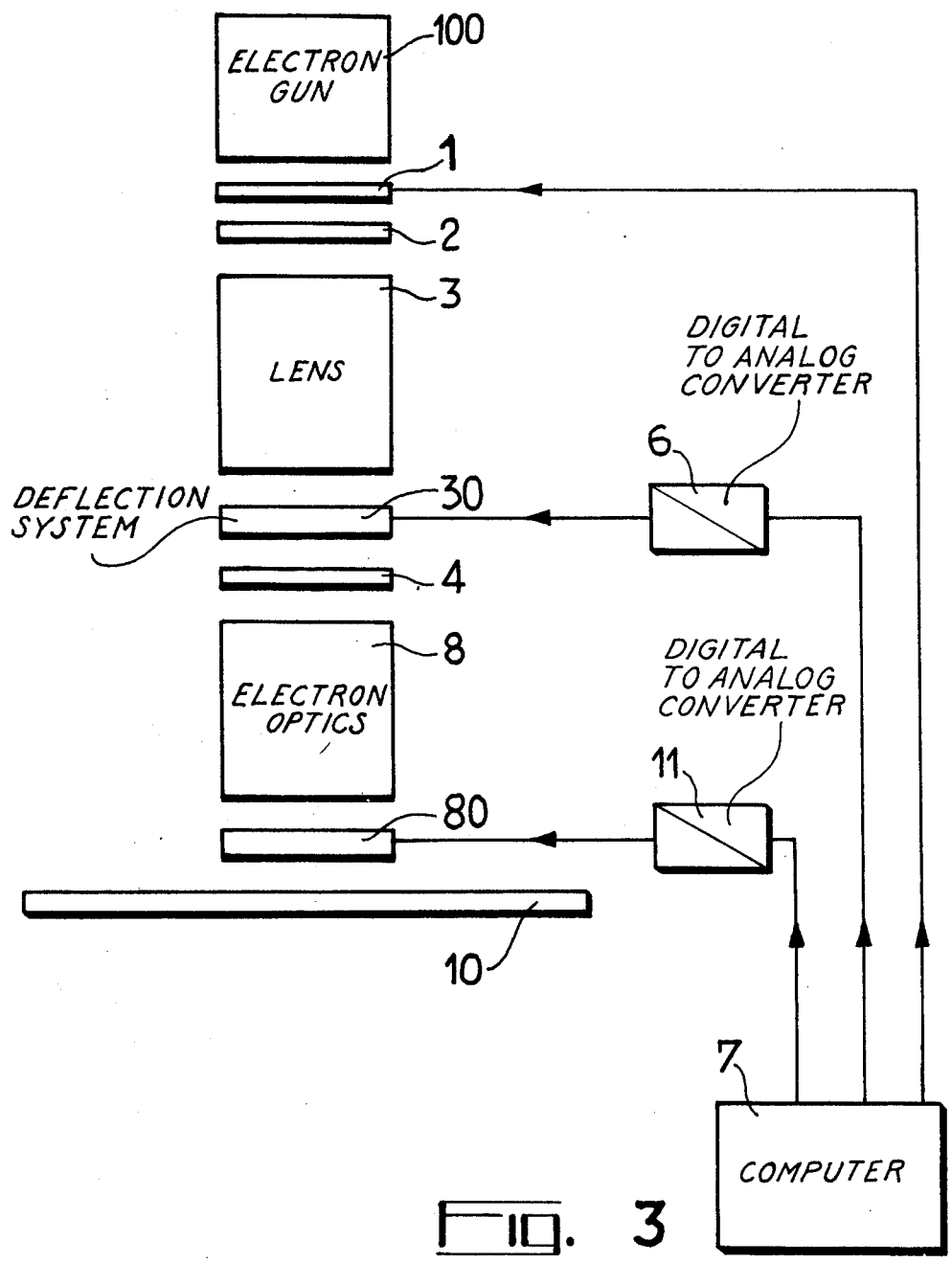
FIG. 3 is the block diagram of the device in accordance with the invention.

Its block diagram has been shown in FIG. 3. It comprises an electron-gun 100 capable of generating an electron beam. The electron beam is delimited by a first, flat diaphragm 2. A first electronic lens 3 produces a real image of this diaphragm, at a constant magnification depending solely upon the lens physical parameters, in the plane of a diaphragm 4. A system 1 controlled by the computer is used to inhibit the beam.

Associated with this lens there is a deflection system 30 capable, under the control of a digital-analogue converter 6 connected to the output of the control computer 7, of displacing the image of the diaphragm 2 in the plane of the diaphragm 4. The beam is then limited by the assembly of the image of the diaphragm 2 and the diaphragm 4. It then passes through another electron-optical system 8 which forms an image of the system constituted by the combination of 4 and the real image of 2, at low magnification, in the plane of the object 10 on which the image is to be formed. Associated with this electronic lens there is a second deflection system 80 supplied with a voltage from another digital-analogue converter 11. The converter controls the deflection system 80 in order to displace the image obtained in the plane 10.

Figure 4A:
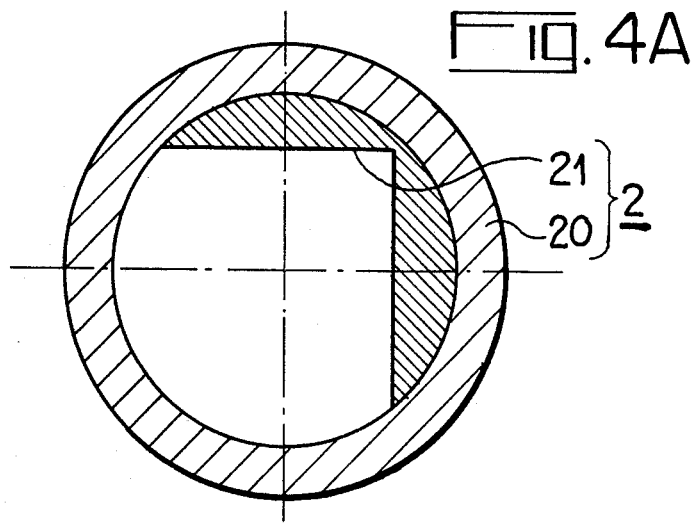
FIGS. 4A, 4B and 4C illustrate an example of the two diaphragms and the final image obtained.
Figure 4B:
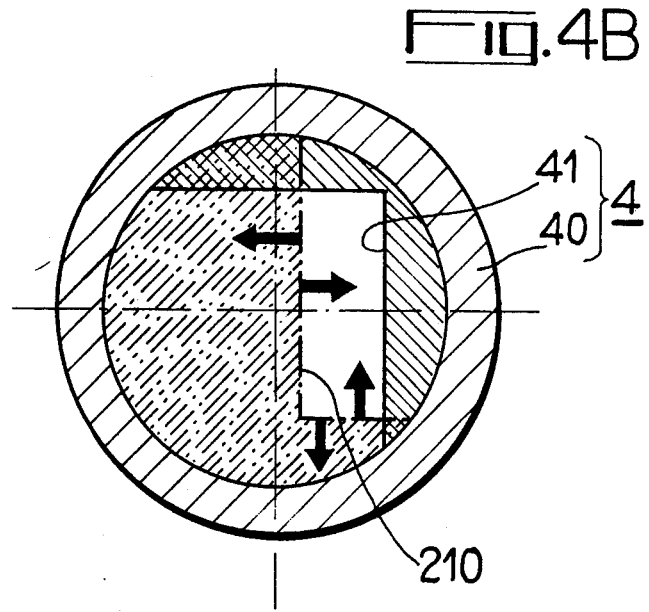
Figure 4C:
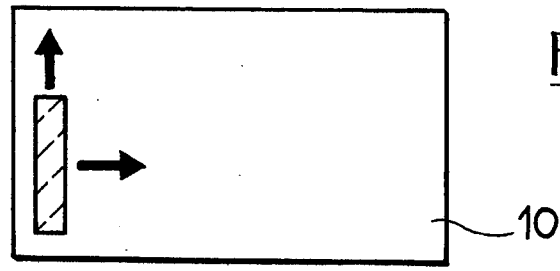

Operation will be better understood from a consideration of FIGS. 4A, 4B and 4C which illustrates the various stages in the formation of the elementary image.

In this figure, at FIG. 4A the diaphragm 2 has been shown. By way of an example which is in no way intended to be limitative of the scope of the invention, this diaphragm takes the form of an angle piece forming a window 21 in a disc 20 opaque to the electron beam.

After passing through this diaphragm, the electron beam passes through the optical system 3 and the deflection system 30. The beam delimited by the diaphragm 2 forms an image of this diaphragm in the plane of the diaphragm 4, with a magnification which in the case of the figure is equal to −1.

At FIG. 4B there can be seen the diaphragm 4 which is identical to that 2.

The deflection system 30 makes it possible to translate the image of the diaphragm 2 in the plane of the diaphragm 4. Everything happens as if there were arranged in the plane of the diaphragm 4 a diaphragm of variable shape and rectangular form, whose sides are on the one hand respective portions of these of the diaphragm 4 and on the other hand respective portions of those of the image 210 of the image of the diaphragm 2 at magnification −1, in the same plane.

The assembly 3-30, by deflecting the beam under the control of the digital-analogue converter displacing the image 210, in the plane of the diaphragm 4, controls the form of the final apparent diaphragm which from then on delimits the contours of the beam downstream of the plane of the diaphragm 4.

The lens 8 or the system 8 which plays the part of an electron-optical system, forms on the object-holder 10 the image created by the two diaphragms, this with a magnification which may be very low. The deflection device 80 controlled by the digital-analogue converter 11 makes it possible, depending upon the commands issued by the computer 7, to displace the image on the object-holder.

Thus, the computer supplies two control outputs which are used to trace the elements of a pattern or design.

(a) A control output determining the shape and dimensions of the elementary image.

(b) A control output command indicating the position upon the object where the image is to be formed, of the projection of this elementary image. The device makes it possible to effect the programmed tracing of a pattern or design by successive projections at different points on the object, of images of different shapes, the shapes of these images and their order of succession being programmed by the data-processing system or computer controlling the overall system.

FIG. 5 illustrates a non-limitative embodiment of the device shown in FIG. 3.

The electron-gun 100 comprises the cathode 101, a modulating electrode 162, respectively at voltages of − 10 Kv and − 9 Kv, and an accelerating anode 103 which is earthed. This latter is arranged in order to form a lens creating a point image A of the cathode. The device 1 for inhibiting the beam is constituted by two plates which can deflect the beam outside the diaphragm 2.

The diaphragm 2 is located downstream at the centre of an electromagnetic lens 31 which, associated with another lens 32 of the same type but located downstream, constitutes the assembly 3. The lens 31 comprises a magnetic circuit in the form of a solid of revolution, 311, into which a coil 312 is inserted, the whole forming a magnetic field parallel to the axis $Z_1 Z_2$ of the system. This lens forms at a point B downstream of its entry pupil, an image of the point A.

A second lens 32 constituted in the same fashion as the lens 31 and having the same optical axis is arranged in order to surround the deflection system 30 which itself surrounds the point B.

This lens has a magnification −1 and is arranged in order to form a real image of the diaphragm 2 in the plane of the diaphragm 4 as indicated earlier.

The system 8 comprises two lenses 81 and 82 centred on the same optical axis of the others and designed in a similar way.

The lens 81 is arranged in order to have its entry pupil in the plane of the diaphragm 4 and to form an image B of the point B at a third point C located level with the centre of deflection of the deflection system 80.

The system 81-82 forms an image of the diaphragm 4, which is located in the plane of the object 10.

The deflection system 30 is electrostatic in nature, the deflection system 80 electromagnetic and constituted by windings forming a magnetic deflection field perpendicularly to the optical axis.

The device in accordance with the invention offers other possibilities.

In other words, the diaphragms 2 and 4 can have shapes other than those described earlier on.

In particular, one of the two diaphragms 2 or 4 may comprise several portions having different contours.

Figure 6A:
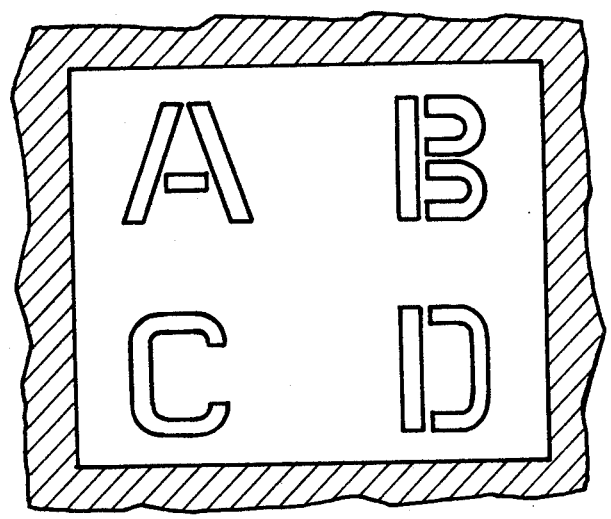

The other diaphragm is then designed to illuminate only one of the portions, selectively. Thus, for example as shown in FIG. 6A the diaphragm 2 comprises several portions each of which represents a letter of the alphabet, designed in the manner of a stencil system.

Figure 6B:
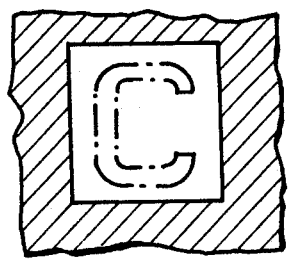

By influencing the deflection system 30 the image of the letters of the diaphragm will be formed at the centre of the diaphragm 4. Thanks to the deflection system 80, the image of this letter will be formed at a determinate point upon the plate. Thus, the system can be used as a high-speed printer as shown in FIG. 6B.

Other embodiments are of course possible, without departing from the scope of the invention. In particular, even in the case where the diaphragms represent simple contours, these need not necessarily be rectangles.

Figure 7:
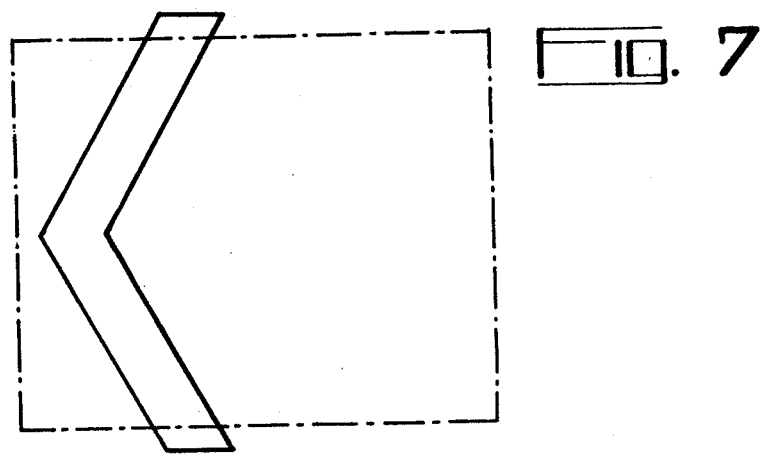
Figure 12:
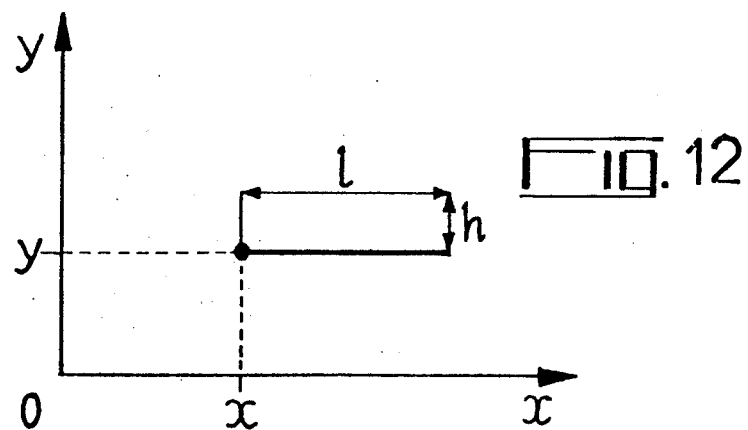
Figure 13:
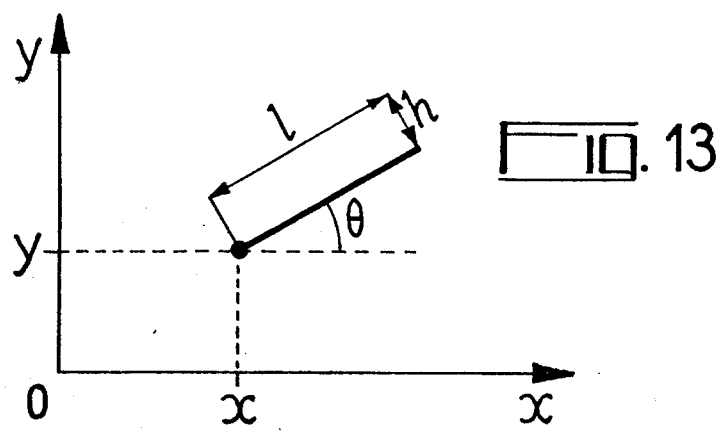

FIG. 7 illustrates an interesting case in which the diaphragm 2 takes the form of a chevron, this being particularly suitable for the manufacture of magnetic bubble stores.

An improvement makes it possible to effect the programmed tracing of figures having differing shapes. In this device, one of the lenses at least, in its electron-optical system, is made of two parts, respectively an electrostatic and electromagnetic part, respectively supplied with a voltage and a current for control purposes, the electromagnetic part making it possible to rotate the image obtained in the object plane, through an angle $\theta$, this rotation being programmed in the digital control device.

This device is described with reference to FIGS. 8 to 13.

FIG. 8 represents this device, which comprises the same organs as that of FIG. 5.

The lens 81 is located downstream of the diaphragm 4. It is constructed in order to form in the same way, the image of point B at point C, and the diaphragm 4 is located at the level of its entry pupil.

The lens is shown in more detail in FIG. 9. It comprises a magnetic part and an electrostatic part, both being solids of revolution about the optical axis of the system.

The electrostatic part 1001 takes the form of a cylinder of revolution made of an amagnetic material. It is inserted into the electromagnetic part 1002. This electromagnetic part 1002 comprises a magnetic circuit 1003 located beneath the diaphragm 4 and taking the form of a cylinder of revolution closed by two covers containing openings to pass the electron beam.

A first digital-analogue converter 1006 supplies a voltage V to the electrostatic lens following a command of digital form issuing from the computer which has not been shown.

A second digital-analogue converter 1004, in the same fashion, supplies a variable current through an excitation coil 1005 inserted into the magnetic circuit between the latter and the electrostatic lens.

The operation of the system will be understood from a consideration of the following explanation.

We will take the two extreme cases:

(1) $V = 0$; in this case the current $i = i_{max}$, being the peak current which the coil can receive, is calculated so that the point B always has its image at C. Between the diaphragm 4 and its image on the object 10, a rotation of $\theta$ is introduced by the purely electromagnetic system 8 of the lenses 81 and 82. In this rotation H, the lens 81 participates to the extent of a value $\theta_{max}$. In FIG. 10, the system 1002 is the only one shown. Everything takes place as if the system 1002 did not exist.

(2) $i = 0$. Everything happens as if the part 1002, namely the electromagnetic part, did not exist.

The excitation of the lens 82, as in the foregoing case, is maintained constant and the voltage $V = V_{max}$ is chosen so that the point B always has its image at C. The image of the diaphragm 4 will in all cases be formed on the object 10 with the same magnification but the lens 81 will no longer participate in the effect of rotating the image of the diaphragm 4.

FIG. 11 illustrates the electrostatic lens on its own, everything happening as if the electromagnetic lens did not exist.

Between these two extreme modes of operation, i and V can acquire values linked by a relationship $(1) f(i, V) = 0$ determined for example experimentally so that the convergence of the lens 81 remains unchanged, that is to say that the image of B is at C and the image of the diaphragm 4 on the object 10. In this case the image of the diaphragm 4 as shown in FIG. 6, is reduced from the image shown in FIG. 5 by a rotation through an angle $\theta < \theta_{max}$ about the axis of revolution of the system.

The computer which has not been shown, produces for each image the compounds $x, y, 1, \theta, h, \theta$ where $\theta$ is a function of the shape F.

$$\theta = F(i, V) \quad (2)$$

$i$ and V being linked by the foregoing relationship (1). These two relationships are recorded in the programme or store of the central computer.

As a first approximation, it can be said that the convergence of the system 82 should be the sum of the respective convergences $(1/f\,es)$ and $(1/f\,em)$ of the electrostatic and electromagnetic lenses.

Between $i$ and V, the relationship $f(i, V) = 0$ should be such that $1/f\,em + 1/f\,es = 1/F =$ constant.

The rotation $\theta$ is substantially proportional to the current $i$.

Considering lenses of usual shape, the approximate relationship $2_{max} \approx L/f\,em$ holds, L being the length of the air-gap in the magnetic circuit.

To obtain all the orientations between $\theta$ and $\pi$, it is necessary that $[\theta_{max}] > \pi/4$ and that $L/f\,em > 0.617$.

It is essential that the lens 81 should respond rapidly to the computer commands.

Two phenomena oppose this, namely.

The self-inductane of the magnetic circuit, which tends to oppose rapid changes in the current.

The Foucault currents in the conductive parts of the system subjected to the magnetic field which tend to oppose variations in this field.

To reduce these phenomena, the magnetic circuit is made of ferrite and since it acts as an electrode, the ferrite is covered with a thin metal layer.

The electrostatic lens is made of an amagnetic and dielectric material covered with a thin metal layer.

What I claim is:

1. A device of the kind in which a particle optical beam projects on to an object an image formed by a successive programmed traces of elementary images, comprising in a first plane a first diaphragm eliminating part of the beam formed by said optical system, a first optical system being provided in order to form a real image of said diaphragm with a given magnification, in a second object plane, said second object plane containing a second diaphragm, said real image and said diaphragm forming an apparent diaphragm, first electrically controlled deflection means being provided and arranged between the first and second object planes in order in programmed fashion to displace said real image in said first object plane and to vary the shape of said apparent diaphragm, a second optical system being provided in order to form the real image of said apparent diaphragm upon the object, and second electrically controlled deflection means being provided in order to displace said real image on said object.

2. A device as claimed in claim 1, wherein said optical system is an electron-optical system.

3. A device as claimed in claim 2, wherein an electrongun forms said beam, said first and second systems being respectively composed of two electron-optical systems, the first system having as its object plane the plane of the first diaphragm and as its image plane the plane of the second diaphragm, the second system having as its object plane the plane of the object on which the image is to be formed, the two deflection systems being respectively associated with the first and second electron-optical systems, and the device having an optical axis.

4. A device as claimed in claim 3, wherein the electrongun is able to concentrate the beam at a first point located upon the optical axis, the first system comprising a first and a second lens, the first diaphragm being located in the entry pupil of the first lens and the latter forming the image of the first point at a second point located in the entry pupil of the second lens, the first deflection means surrounding said second point.

5. A device as claimed in claim 4, wherein said second system comprises a third and a fourth lens, the third lens having its entry pupil in the plane of the second diaphragm and having said second point as the object whilst its image is a third point, the second deflection system being located in the neighbourhood of said third point.

6. A device as claimed in claim 5, wherein the second system comprises at least one hybrid electrostatic-electromagnetic lens, said lens being supplied on the one hand with a control voltage applied to its electrostatic section and on the other with a control current to its electromagnetic section, the relationship between the current and the voltage being such that the magnification and convergence of the lens are constant.

7. A device as claimed in claim 6, characterized in that said lens has its entry pupil located in the plane of the second diaphragm and its axis of revolution is the axis of the system.

8. A device as claimed in claim 7, characterized in that said lens comprises a magnetic circuit excited by a coil, the whole surrounding an electrostatic lens.

9. A device as claimed in claim 8, characterised in that the magnetic circuit is essentially constituted of ferrite and an electrostatic lens of an amagnetic material covered with a thin conductive filter.

10. A device as claimed in claim 9, characterised in that said antimagnetic material is a dielectric material.

11. a device as claimed in claim 1, characterised in that the magnification of said first system is equal to −1.

12. A device as claimed in claim 11, wherein said first and second diaphragms take the form of two angle pieces with their sides arranged parallel to one another in pairs.

13. A device as claimed in claim 11, wherein in that one of the two diaphragms comprises a plurality of elementary areas the other having a dimension equal to that of said elementary areas, the superimposition of the two diaphragms making it possible to select one of said elementary areas.

* * * * *